(12) United States Patent
Iucolano

(10) Patent No.: US 10,896,969 B2
(45) Date of Patent: Jan. 19, 2021

(54) MANUFACTURING METHOD OF AN HEMT TRANSISTOR OF THE NORMALLY OFF TYPE WITH REDUCED RESISTANCE IN THE ON STATE AND HEMT TRANSISTOR

(71) Applicant: STMICROELECTRONICS S.R.L., Agrate Brianza (IT)

(72) Inventor: Ferdinando Iucolano, Gravina di Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 16/254,322

(22) Filed: Jan. 22, 2019

(65) Prior Publication Data
US 2019/0229203 A1    Jul. 25, 2019

(30) Foreign Application Priority Data

Jan. 23, 2018   (IT) .............................. 1020180001693

(51) Int. Cl.
*H01L 29/66*   (2006.01)
*H01L 29/10*   (2006.01)
(Continued)

(52) U.S. Cl.
CPC .... *H01L 29/66462* (2013.01); *H01L 21/2258* (2013.01); *H01L 21/3245* (2013.01);
(Continued)

(58) Field of Classification Search
CPC .............. H01L 29/66; H01L 29/66462; H01L 29/66431; H01L 29/10; H01L 29/20;
(Continued)

(56) References Cited

U.S. PATENT DOCUMENTS 5,073,895 A * 12/1991 Omura .................. H01S 5/2203
                                                                372/46.01
2009/0212325 A1   8/2009 Sato
(Continued)

OTHER PUBLICATIONS

Hilt et al., "Normally-off AlGaN/GaN HFET with p-type GaN Gate and AlGaN Buffer," *Proceedings of the 22nd International Symposium on Power Semiconductor Devised & IC's*, Jun. 6-10, 2010, Hiroshima, Japan, pp. 347-350.
(Continued)

*Primary Examiner* — Chuong A Luu
(74) *Attorney, Agent, or Firm* — Seed Intellectual Property Law Group LLP

(57) ABSTRACT

A manufacturing method of an HEMT includes: forming a heterostructure; forming a first gate layer of intrinsic semiconductor material on the heterostructure; forming a second gate layer, containing dopant impurities of a P type, on the first gate layer; removing first portions of the second gate layer so that second portions, not removed, of the second gate layer form a doped gate region; and carrying out a thermal annealing of the doped gate region so as to cause a diffusion of said dopant impurities of the P type in the first gate layer and in the heterostructure, with a concentration, in the heterostructure, that decreases as the lateral distance from the doped gate region increases.

17 Claims, 4 Drawing Sheets

(51) Int. Cl.
  *H01L 29/778* (2006.01)
  *H01L 21/324* (2006.01)
  *H01L 21/225* (2006.01)
  *H01L 29/20* (2006.01)

(52) U.S. Cl.
  CPC ...... *H01L 29/1066* (2013.01); *H01L 29/2003* (2013.01); *H01L 29/778* (2013.01); *H01L 29/7786* (2013.01)

(58) Field of Classification Search
  CPC ............. H01L 29/7782; H01L 29/7786; H01L 29/7781; H01L 29/778; H01L 29/0688; H01L 29/7783; H01L 21/38; H01L 21/225; H01L 21/2251; H01L 21/2258; H01L 21/3245; H01L 2924/13064
  USPC .................................. 257/194; 438/167, 172
  See application file for complete search history.

(56) References Cited

U.S. PATENT DOCUMENTS

2012/0129301 A1\* 5/2012 Or-Bach ............. H01L 21/6835
  438/129
2013/0256684 A1 10/2013 Nishimori et al.

OTHER PUBLICATIONS

Hilt et al., "Normally-off- High-Voltage p-GaN Gate GaN HFET with Carbon-Doped Buffer," *Proceedings of the 23$^{rd}$ International Symposium on Power Semiconductor Devices & IC's*, May 23-26, 2011, San Diego, California, USA, pp. 239-242.

Lin, "Market and Technology Trends in WBG Materials for Power Electronics Applications," *CS MANTECH Conference*, May 18-21, 2015, Scottsdale, Arizona, USA, pp. 33-36.

\* cited by examiner

MANUFACTURING METHOD OF AN HEMT TRANSISTOR OF THE NORMALLY OFF TYPE WITH REDUCED RESISTANCE IN THE ON STATE AND HEMT TRANSISTOR

BACKGROUND

Technical Field

The present disclosure relates to a method of invention a high-electron-mobility transistor (HEMT) of a normally off type with reduced ON state resistance, and to a HEMT of a normally off type with reduced ON state resistance.

Description of the Related Art

Known to the art are HEMTs with a heterostructure, in particular of gallium nitride (GaN) and aluminum gallium nitride (AlGaN), at the interface of which a conductive channel may form, in particular a two-dimensional electron gas (2DEG) channel. For instance, HEMTs are appreciated for their use as high-frequency switches and as power switches, thanks to their high breakdown threshold and to the high electron mobility and density of charge carriers in their conductive channel. In addition, the high current density in the conductive channel of the HEMT affords a low ON state resistance (or simply RON) of the conductive channel.

In HEMTs of a known type, in which a gate electrode extends over the AlGaN/GaN heterostructure, the conductive channel is normally on, in so far as a high density of charge carriers is present even in the absence of a gate voltage applied to the heterostructure.

For reasons of safety and in order to simplify driving circuits of HEMTs, thus favoring use thereof in industrial applications, there have been introduced HEMTs in which the conductive channel is normally off, such as the so-called p-GaN gate transistor.

FIG. 1 is a schematic illustration of a HEMT 1 of a known type in a triad of mutually orthogonal axes x, y, z in lateral sectional view in the plane xz. In particular, the HEMT 1 is a p-GaN gate transistor.

The HEMT 1 includes a semiconductor body 2, which in turn comprises a substrate 4, a buffer layer 6, which extends over the substrate 4, and a heterostructure 7, which extends over the buffer layer 6.

The substrate 4 is made, for example, of silicon, silicon carbide (SiC), sapphire (Al2O3), or GaN.

The buffer layer 6 is made of gallium aluminum nitride, or else of gallium nitride, of an intrinsic type or with a doping of an N type, or with carbon and/or iron doping.

The heterostructure 7 includes, in particular, a channel layer 10, which extends over the buffer layer 6, and a barrier layer 9, which extends over the channel layer 10. The channel layer 10 is made of gallium nitride (GaN) of an intrinsic type. The barrier layer 9 is made of aluminum gallium nitride (AlGaN).

The HEMT 1 further comprises a source electrode 16 and a drain electrode 18, both of conductive material, such as titanium (Ti), aluminum (Al), tantalum (Ta), or titanium nitride (TiN).

The source electrode 16 and the drain electrode 18 extend at a distance from one another, on the heterostructure 7 and in depth in the heterostructure 7. For instance, the source electrode 16 and the drain electrode 18 may extend in depth along the axis z throughout the thickness of the barrier layer 9 and partially through the channel layer 10.

The HEMT 1 further comprises a doped gate region 12, which extends over the heterostructure 7, between the source electrode 16 and the drain electrode 18 and at a distance therefrom. In particular, the doped gate region 12 is, for example, of gallium nitride with a doping of a P type, for example using magnesium (Mg).

The HEMT 1 further comprises a gate electrode 14, of a conductive material, such as tantalum (Ta), tantalum nitride (TaN), titanium nitride (TiN), palladium (Pa), tungsten (W), tungsten silicide (WSi2), titanium aluminum (Ti/Al), or nickel gold (Ni/Au), which extends over the doped gate region 12. The structure formed by the gate electrode 14 and by the doped gate region 12 is known in the prior art as "p-GaN gate", whence the name "p-GaN gate transistor" for the HEMT 1.

As is known, the doped gate region 12 modifies the band diagram of the heterostructure 7 so that, in the absence of a gate voltage applied to the gate electrode 14, the 2DEG is depleted in the area underneath the doped gate region 12, i.e., the area of the heterostructure 7 overlying the doped gate region 12 in a top plan view of the HEMT 1. Consequently, in the absence of an applied gate voltage, there is no conductive channel connecting the source electrode 16 and the drain electrode 18.

A known drawback of the HEMT 1, and in general of p-GaN gate transistors, is due to their relatively low threshold voltage. A way for increasing the threshold voltage of the HEMT 1 consists in increasing the concentration of dopant of a P type, for example of magnesium, in the doped gate region 12 and in particular in the proximity of the interface with the barrier layer 9. For instance, the doped gate region 12 has a doping profile such that the concentration of magnesium at the interface between the doped gate region 12 and the barrier layer 9 is comprised between $10^{17}$ cm$^{-3}$ and $5\times10^{19}$ cm$^{-3}$, for example $10^{19}$ cm$^{-3}$.

However, increasing the concentration of doping in the doped gate region 12 leads indirectly to an undesired increase in the ON state resistance (RON) of the HEMT device 1. In particular, the increase in the ON state resistance is due to a diffusion of dopant impurities, for example magnesium, from the doped gate region 12 to the regions of the heterostructure 7 that extend, in a top plan view of the HEMT 1, between the gate electrode 14 and, respectively, the source electrode 16 and drain electrode 18. The presence of magnesium in said regions of the heterostructure 7 leads to a partial depletion of the 2DEG and consequently an undesired increase in the ON state resistance. Consequently, in order to limit the increase in the ON state resistance it is necessary to reduce as much as possible the concentration of magnesium in the heterostructure 7.

In particular, the above diffusion of magnesium from the doped gate region 12 to the heterostructure 7 is a direct consequence of the manufacturing method typically used for the HEMT device 1, in which, following upon formation of the heterostructure 7, the doped gate region 12 is obtained by:

a first step in which an epitaxial layer of magnesium-doped gallium nitride is deposited on the barrier layer 9;

a second step, in which the epitaxial layer is subjected to a thermal annealing to activate the magnesium, carried out at simultaneously with the first step or immediately after the first step; and a third step, carried out following upon the second step, in which the epitaxial layer is chemically etched for selective removal of portions of the epitaxial layer and thus formation of the doped gate region 12.

In particular, the aforementioned second step leads to an undesired diffusion of the magnesium in the heterostructure 7, in particular in the regions between the gate electrode 14 and, respectively, the source electrode 16 and drain electrode 18.

Further, the chemical etching carried out in the third step may lead to an undesired reduction in the thickness of the barrier layer 9, and consequently a further increase in the ON state resistance.

BRIEF SUMMARY

One or more embodiments of the present disclosure provide a transistor of a normally off type with a good compromise between high threshold voltage and reduced ON state resistance so as to overcome at least some of the drawbacks of the prior art.

One or more embodiments of the present disclosure provide a manufacturing method of a HEMT, and a corresponding HEMT that will be able to overcome at least some of the drawbacks of the prior art.

According to the present disclosure a manufacturing method of a HEMT, and a corresponding HEMT are thus provided, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
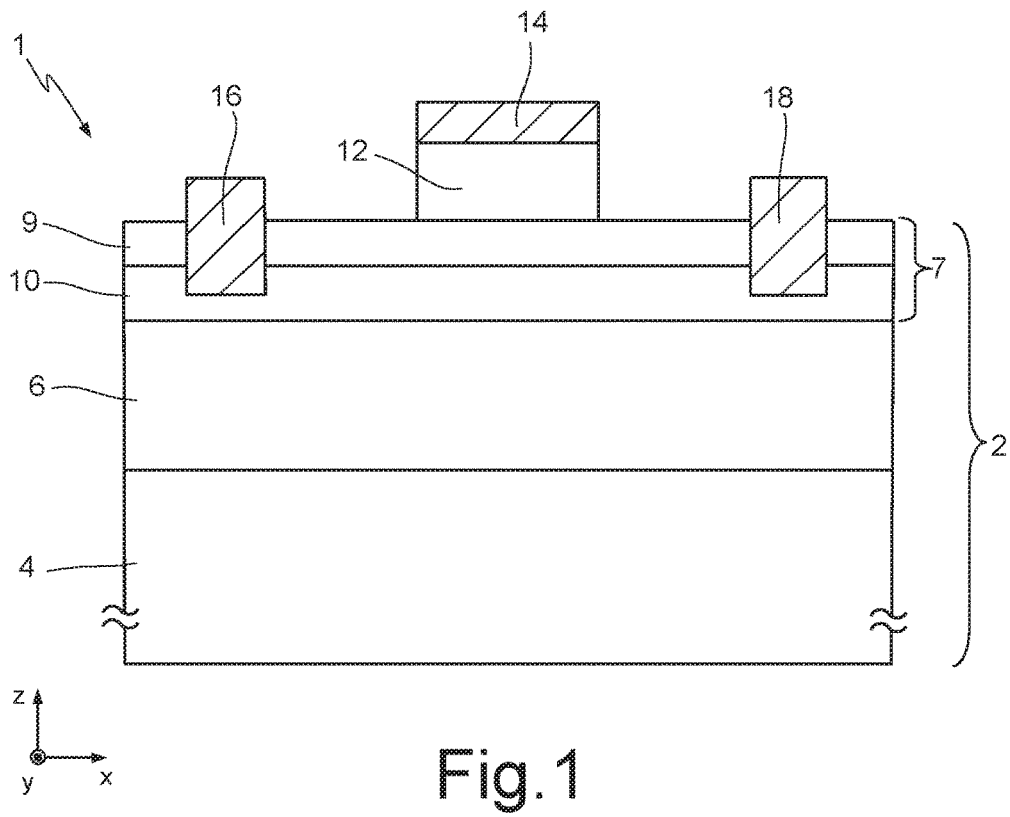
FIG. 1 shows a HEMT in lateral sectional view.
Figure 2:
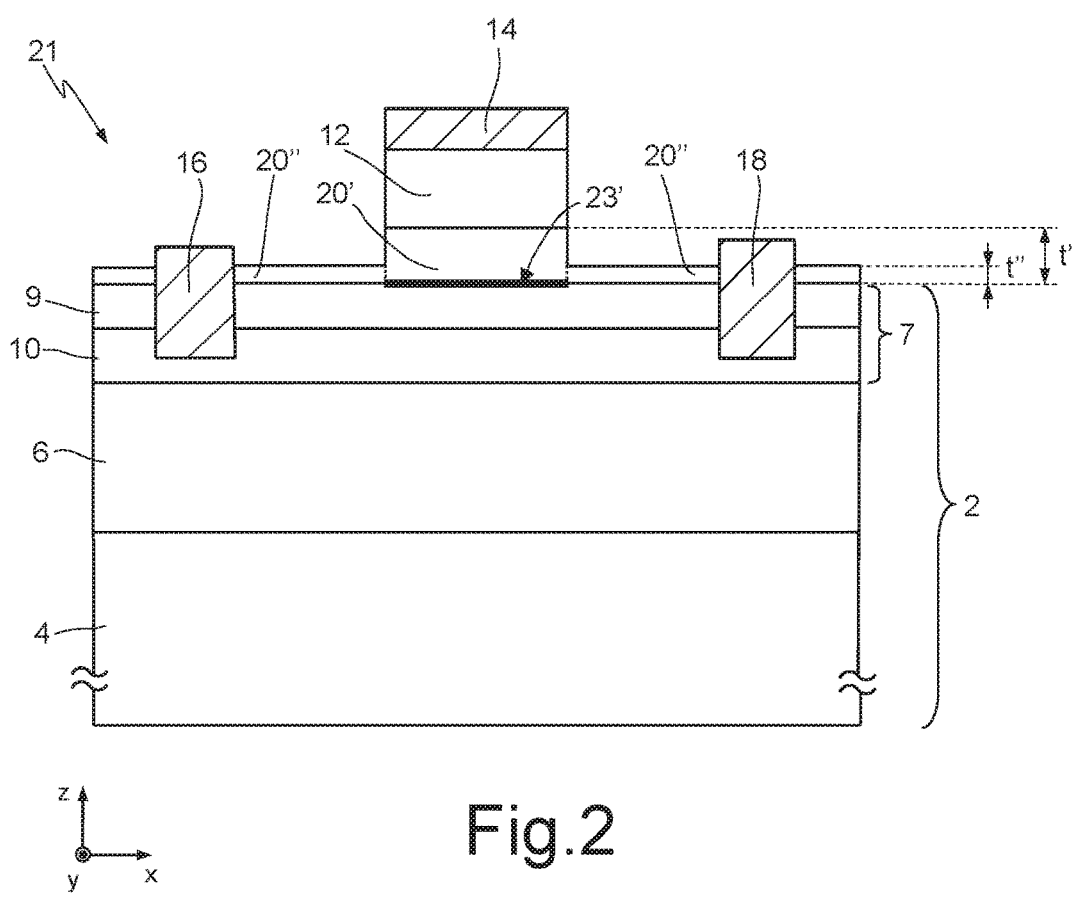
FIG. 2 shows a HEMT according to an embodiment of the present disclosure in lateral sectional view.

FIG. 2 is a schematic illustration of a HEMT 21 according to an embodiment of the present disclosure. In particular, FIG. 2 illustrates the HEMT 21 in a triad of mutually orthogonal axes x, y, z, in lateral sectional view in the plane xz. Elements of the HEMT 21 of FIG. 2 that are in common with the HEMT 1 of FIG. 1 are designated by the same reference numbers.

The HEMT 21 of FIG. 2 differs from the HEMT 1 of FIG. 1 for the presence of a diffusion-control region 20', made, for example, of gallium nitride, which extends on the heterostructure 7.

In particular, the diffusion-control region 20' extends between the doped gate region 12 and the heterostructure 7, and has a thickness t' comprised, for example, between 5 nm and 30 nm, for example 20 nm. In a top plan view of the HEMT 21, the doped gate region 12 and the auxiliary gate region 20' are arranged on top of one another. In particular, the doped gate region 12 extends completely over, and in direct contact with, the auxiliary gate region 20', covering it entirely.

As described in greater detailed hereinafter, in particular in the description of the manufacturing method of the HEMT 21, the thickness t' of the auxiliary gate region 20' is designed so that, in a step of activation of the dopant impurities in the doped gate region 12, a part of said impurities spreads through the auxiliary gate region 20' up to a surface 23' of interface with the barrier layer 9. In particular, the concentration of dopant impurities at the surface of interface 23' is comprised, for example, between $10^{17}$ cm$^{-3}$ and $10^{19}$ cm$^{-3}$, for example $2 \times 10^{18}$ cm$^{-3}$. Consequently, the diffusion-control region 20' is further a region with a high concentration of dopant impurities of a P type, as the doped gate region 12. In addition, the high concentration of magnesium at the interface between the barrier layer 9 and the diffusion-control region 20' entails a desired increase of the threshold voltage of the HEMT 21, as has been described for the HEMT 1.

The HEMT 21 may further comprise a protection region 20", made, for example, of intrinsic gallium nitride, which extends over the heterostructure 7, and in particular in contact with the regions of the heterostructure 7 that in a top plan view in the plane xy are not arranged on top of the doped gate region 12. In other words, the protection region 20" entirely covers the regions of the heterostructure 7 not covered by the diffusion-control region 20'.

The protection region 20" has a thickness t" sufficient to protect the heterostructure 7. For instance, the thickness t" of the protection region 20" is comprised between 1 nm and 5 nm, for example, 2 nm. Preferably, the protection region 20" has a thickness t" smaller than the thickness t' of the diffusion-control region 20', and consequently is not in contact with the doped gate region 12.

In the HEMT 21, the source electrode 16 and drain electrode 18 extend over the protection region 20" and in depth along the axis z throughout the thickness of the protection region 20" and of the barrier layer 9, and partially through the channel layer 10.

According to an aspect of the present disclosure, the concentration of magnesium is negligible in the regions of the heterostructure 7 underneath the protection region 20" (i.e., between the gate and drain, and the gate and source), and consequently there is no undesired increase of the ON state resistance. In particular, the concentration of magnesium in regions of the heterostructure 7 at a distance larger than 20 nm from the surface of interface 23' is for example less than $10^{17}$ cm$^{-3}$.

The buffer layer 6 has a thickness, for example, comprised between 1 μm and 8 μm, for example, 5 μm.

The channel layer 10 has a thickness, for example, comprised between 100 nm and 1 μm, for example, 300 nm.

The barrier layer 9 has a thickness, for example, comprised between 5 nm and 30 nm, for example, 15 nm.

The doped gate region 12 has a thickness, for example, comprised between 10 nm and 200 nm, for example, 50 nm.

Illustrated in what follows, with reference to FIGS. 3A-3F, are steps of a manufacturing method of the HEMT device 21 of FIG. 2.

Figure 3A:
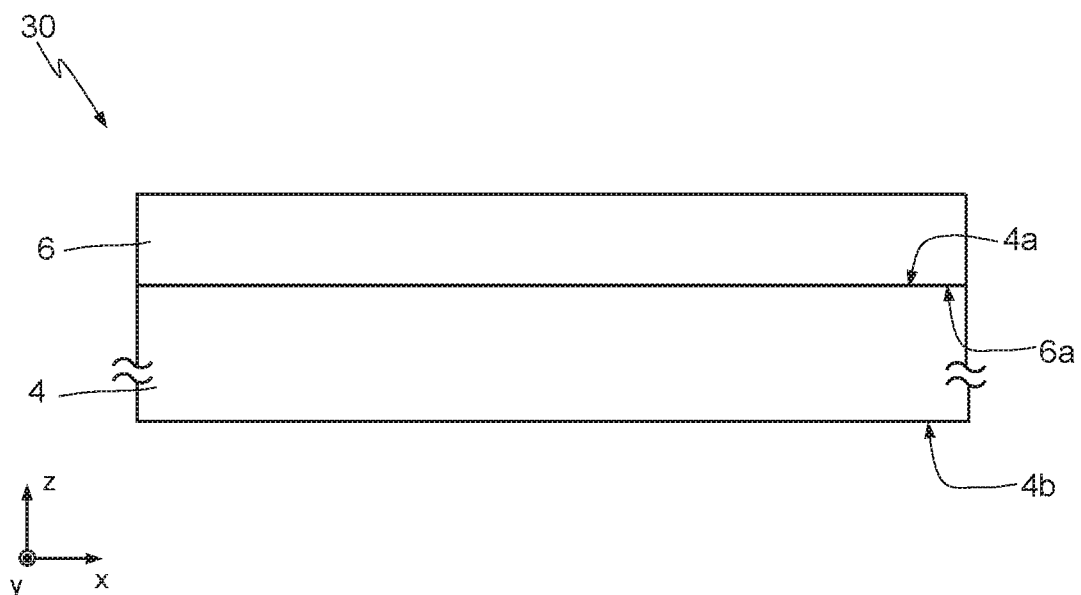
FIGS. 3A-3F show steps of a manufacturing method of the HEMT of FIG. 2.
Figure 3B:
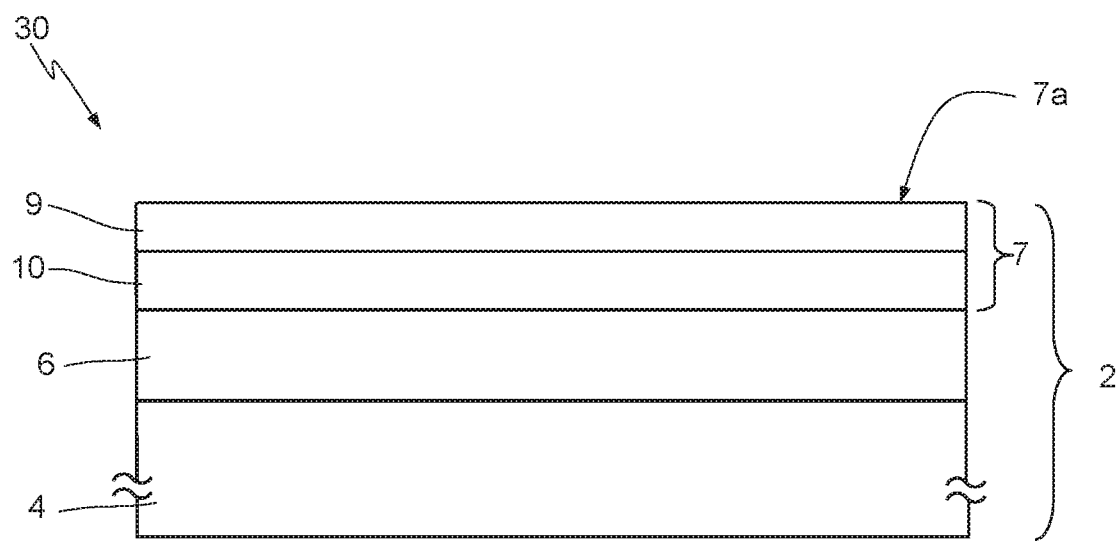
Figure 3C:
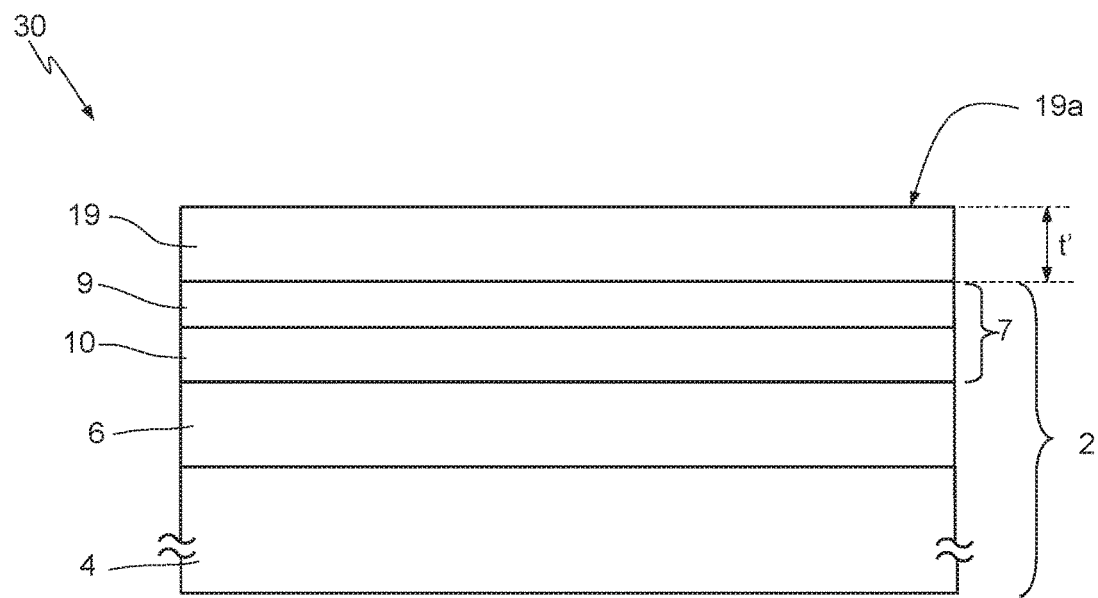
Figure 3D:
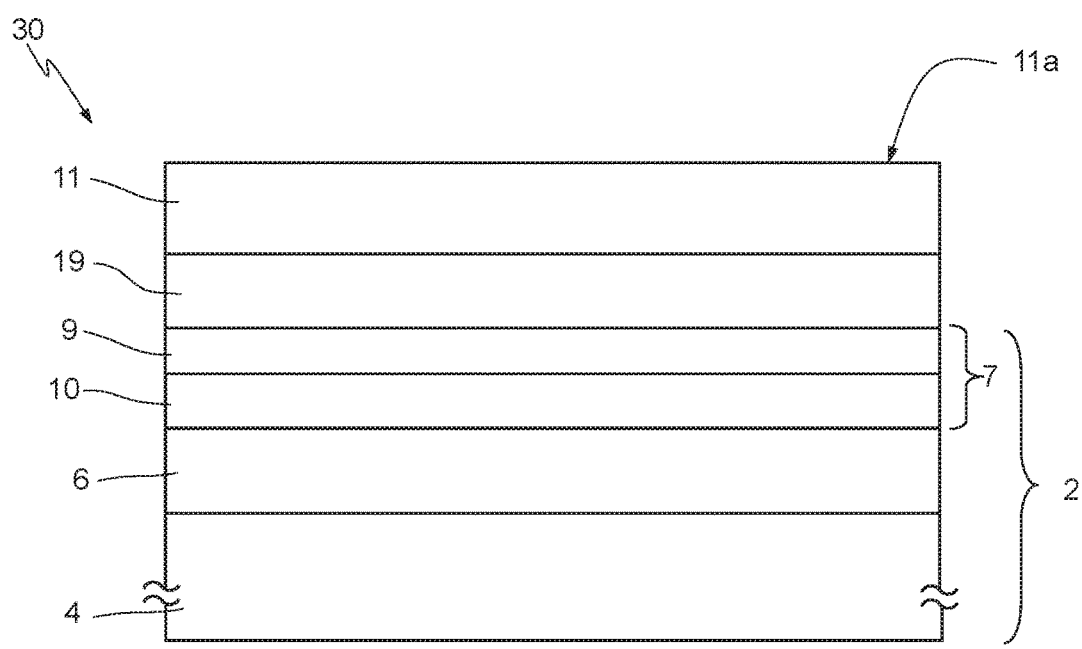
Figure 3E:
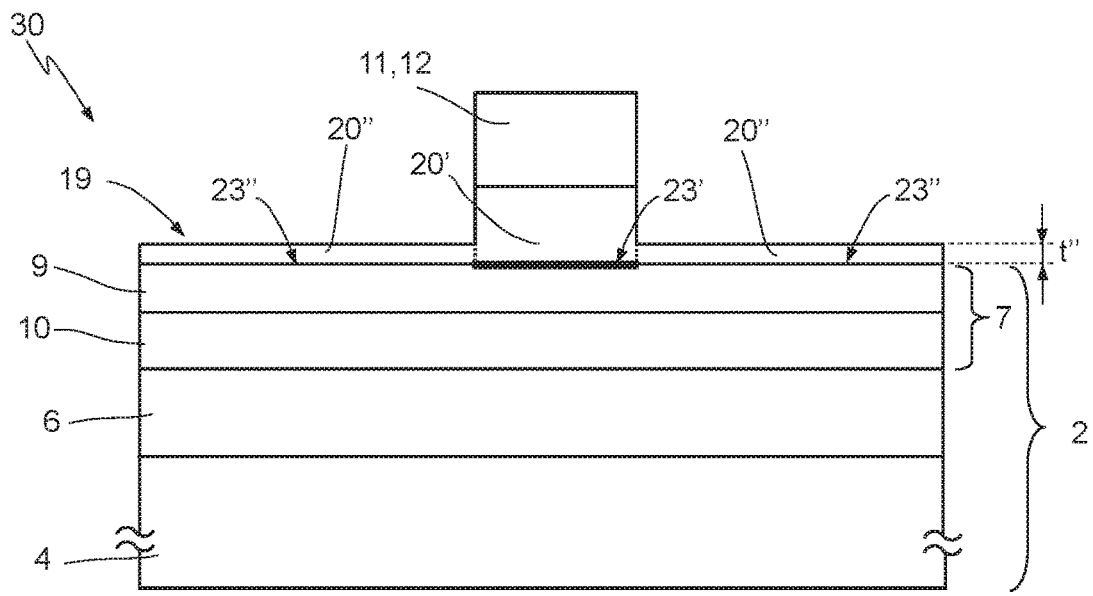
Figure 3F:
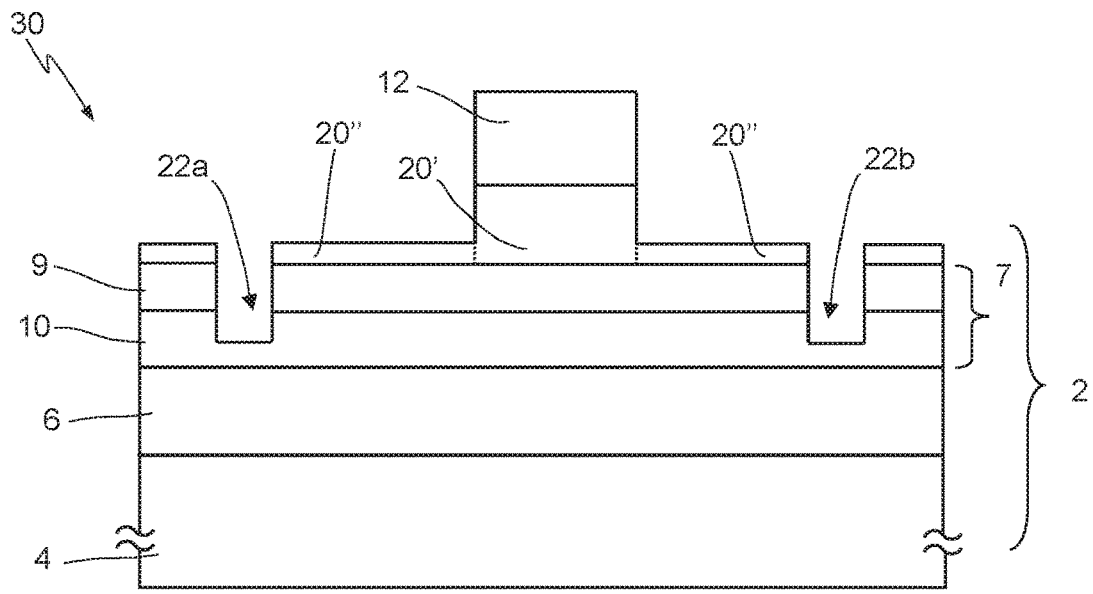

FIG. 3A shows, in lateral sectional view, a portion of a wafer 30 during a step of manufacture of the HEMT device 21, according to an embodiment of the present disclosure. Elements of the wafer 30 that are common to what has already been described with reference to FIG. 2, and illustrated in said FIG. 2, are designated by the same reference numbers.

In particular (FIG. 3A), the wafer 30 comprising the substrate 4 is made, for instance, of silicon (Si), silicon carbide (SiC), aluminum oxide ($Al_2O_3$), or gallium nitride (GaN), and has a front side 4a and a back side 4b opposite to one another in the direction z. The wafer 30 further comprises the buffer layer 6, which is made of aluminum gallium nitride (AlGaN), gallium nitride (GaN) whether intrinsic or with a doping of an N type, and has its own underside 6a that extends on the front side 4a of the substrate 4 (with the possible intermediate presence of further interface layers, not illustrated in the figures).

This is followed (FIG. 3B) by formation of the heterostructure 7. In a first step the channel layer 10, of intrinsic gallium nitride (GaN), is formed, for example via epitaxial growth. The channel layer 10 has a thickness, for example, comprised between 100 nm and 1 µm, for example 300 nm. Next, the barrier layer 9 of aluminum and gallium nitride (AlGaN) is formed, for example via epitaxial growth. The barrier layer 9 has a thickness comprised between 5 nm and 30 nm, for example, 15 nm. The top side, which is exposed, of the barrier layer 9 forms a front side 7a of the heterostructure 7.

This is followed (FIG. 3C) by formation, on the front side 7a of the heterostructure 7, of a first epitaxial layer 19, for instance, of intrinsic gallium nitride, which in subsequent steps of the manufacturing method forms the auxiliary gate region 20' and the protection region 20". The first epitaxial layer 19 has a thickness equal to the thickness t' of the auxiliary gate region 20' of the HEMT 21 of FIG. 2. The top side, which is exposed, of the first epitaxial layer 19 forms a front side 19a of the first epitaxial layer 19.

Next (FIG. 3D), formed on the front side 19a of the first epitaxial layer 19, is a second epitaxial layer 11, for example of gallium nitride with a doping of a P type, for example using magnesium, which in subsequent steps of the manufacturing method forms the doped gate region 12. The second epitaxial layer 11 has a thickness comprised, for example, between 10 nm and 200 nm, for example, 50 nm. The top side, which is exposed, of the second epitaxial layer 11 forms a front side 11a of the second epitaxial layer 11.

According to one aspect of the present disclosure, the second epitaxial layer 11 is formed, for example, via metalorganic chemical vapor deposition (MOCVD), in which the gallium nitride is grown directly with a concentration of magnesium doping comprised between $10^{18}$ cm$^{-3}$ and $5 \times 10^{19}$ cm$^{-3}$, for example, $2 \times 10^{19}$ cm$^{-3}$. In particular, this step is carried out in an MOCVD reactor in an environment that has a magnesium precursor and at a temperature comprised, for example, between 900° C. and 1200° C., for example, 1050° C. Furthermore, this step is carried out so as to hinder diffusion of magnesium dopant impurities from the second epitaxial layer 11 to other portions of the wafer 30. Consequently, at the end of the step of FIG. 3D, the magnesium dopant impurities in the second epitaxial layer 11 are not yet activated, and have diffused only partially in other portions of the wafer 30. In particular, the concentration of magnesium in the first epitaxial layer 19 is negligible in the proximity of the barrier layer 9. In particular, the concentration of magnesium is less than $10^{17}$ cm$^{-3}$ at the interface between the first epitaxial layer 19 and the barrier layer 9 and throughout the thickness of the barrier layer 9. In addition, the concentration of magnesium is less than $10^{16}$ cm$^{-3}$ throughout the thickness of the channel layer 10.

This is followed (FIG. 3E) by selective etching of the first and second epitaxial layers 11, 19, using a first lithographic mask configured to protect from etching selective portions thereof. In particular, the selective portions of the first and second epitaxial layers 11, 19 protected by the first lithographic mask extend in regions of the wafer 30 in which the gate electrode 14, the doped region 12, and the auxiliary gate region 20' are to be provided.

In particular, the selective etching proceeds up to complete removal of the portions of the first epitaxial layer 11 not protected by the first lithographic mask. In addition, the selective etching proceeds until the thickness of the second epitaxial layer 19 is reduced, in portions thereof not protected by the first lithographic mask, to a value equal to the thickness t" of the protection region 20" of the HEMT 21 of FIG. 2. The protection region 20" is thus formed.

Once selective etching of the first and second epitaxial layers 11, 19 is terminated, a step of thermal annealing of the wafer 30 is carried out in order to activate the magnesium dopant impurities present in the first epitaxial layer 11.

Further, during annealing, the dopant impurities diffuse in depth from the first epitaxial layer 11 to the second epitaxial layer 19 until a first surface 23' is reached, arranged at the interface between the barrier layer 9 and the second epitaxial layer 19, and entirely on top of the first epitaxial layer 11 in a top plan view of the wafer 30. In particular, during thermal annealing the first surface 23' coincides with the first epitaxial layer 11 in respective orthogonal projections in the plane xy. The doped gate region 12 and the auxiliary gate region 20' are thus formed.

According to an aspect of the present disclosure, the concentration of dopant impurities with which the first epitaxial layer 11 is grown, the thickness t' of the second epitaxial layer 19, and the process parameters of annealing are designed so that, at the end of annealing, the concentration of magnesium at the first surface 23' is comprised, for example, between $10^{18}$ cm$^{-3}$ and $10^{19}$ cm$^{-3}$, for example, $5 \times 10^{18}$ cm$^{-3}$.

In particular, thermal annealing may comprise a step of rapid thermal annealing (RTA), in which the wafer 30 is subject to the following temperature profile: (i) heating from room temperature to a high temperature, for example comprised between 700° C. and 1000° C., for example, 800° C., during a first time interval comprised, for example, between 1 s and 10 s, for example, 5 s; (ii) permanence at said high temperature for a second time interval comprised, for example, between 10 s and 5 min, for example, 2 min; (iii) cooling from said high temperature to room temperature, during a third time interval comprised, for example, between 1 s and 10 s, for example 5 s.

Thermal annealing leaves the concentration of magnesium in the portions of the second epitaxial layer 19 that form the protection region 20" substantially unvaried, thanks to the prior removal of the portions of the epitaxial layer 11 on said portions of the second epitaxial layer 19. The concentration of magnesium is thus less than 1017 cm-3 on a second surface 23" at the interface between the protection region 20" and the barrier layer 9, and throughout the thickness of the barrier layer 9 underneath the second surface 23". Further, the concentration of magnesium is less than $10^{16}$ cm$^{-3}$ throughout the thickness of the channel layer 10 underneath the second surface 23".

There then follows (FIG. 3F) etching of selective portions of the protection region 20" and of the heterostructure 7 using a second lithographic mask, which leaves exposed and thus subject to etching the areas of the wafer 30 in which the source and drain electrodes 16, 18 of the HEMT 21 of FIG. 2 are to be formed. In particular, a first opening 22a and a second opening 22b are formed on opposite sides, along the axis x, of the doped gate region 12, and at a distance from the doped gate region 12. Each of the first and second openings 22a, 22b extends in depth through the protection region 20" and the heterostructure 7, terminating within the channel layer 10.

Then, a step of formation of ohmic contacts is carried out to provide the source electrode 16 and the drain electrode 18, depositing conductive material, in particular metal, such as titanium (Ti) or aluminum (Al), or alloys or compounds thereof, using a sputter or evaporator and a lift-off photolithographic mask, inside the openings 22a, 22b. The conductive material fills the openings 22a, 22b completely, to form the source electrode 16 and the drain electrode 18, respectively. Consequently, the portions of the heterostructure 7 that extend, in a top plan view of the wafer 30, between the doped gate region 12 and, respectively, the source electrode 16 and drain electrode 18 have a negligible concentration of magnesium. Following upon deposition, a step of rapid thermal annealing is carried out, for example at a temperature of approximately between 500° C. and 900° C. for a time comprised between 30 s and 2 min.

Then, a step of deposition of conductive material on the wafer 30 is carried out to form the gate electrode 14 on the doped gate region 12. For instance, the gate electrode is made of metal material, such as tantalum (Ta), tantalum nitride (TaN), titanium nitride (TiN), palladium (Pa), tungsten (W), tungsten silicide ($WSi_2$), titanium aluminum (Ti/Al), or nickel gold (Ni/Au).

The HEMT 21 of FIG. 2 is thus formed.

In another embodiment (not illustrated in the figures), the protection region 20" is absent. In this case, the step of chemical etching of the second epitaxial layer 19 is carried out up to entire removal of the portions of the second epitaxial layer 19 not protected by the first lithographic mask. In this case, the heterostructure 7 is not protected from the external environment.

In another embodiment (not illustrated in the figures), the protection region 20" has the same thickness as the auxiliary gate region 20'. In this case, the respective manufacturing method does not comprise a step of etching of the second epitaxial layer 19. However, a large thickness of the protection region 20" could affect in an undesirable way the properties of the 2DEG. For instance, it could partially deplete the 2DEG underneath the protection region 20" and thus increase the ON state resistance of the HEMT. From an examination of the characteristics of the disclosure described and illustrated herein the advantages that it affords are evident.

For instance, the HEMT according to the present disclosure achieves a good compromise between high threshold voltage and low ON state resistance. This is due to the fact that, unlike p-GaN gate transistors of a known type, the thermal annealing to activate dopant impurities in an epitaxial layer with a high concentration of dopant impurities (i.e., the first epitaxial layer 11 in the present disclosure) is carried out following upon a step of selective removal of portions of said epitaxial layer, and in particular of the portions external to a gate region of the HEMT. Consequently, the dopant impurities may diffuse only towards regions of the heterostructure underlying the gate region in order to increase the threshold voltage, whereas it may not diffuse in the regions of the heterostructure that connect the gate region to the source and drain regions, thus preventing an increase in the ON state resistance.

Finally, it is clear that modifications and variations may be made to the disclosure described and illustrated herein, without thereby departing from the scope of the present disclosure.

For instance, the source electrode 16 and the drain electrode 18 may extend at different depth in the heterostructure 7 or may be formed on top of the heterostructure 7, in direct contact therewith.

Furthermore, the doped gate region 12 and the auxiliary gate region 20' may be made of some other material, such as aluminum and gallium nitride with a doping of a P type, respectively.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a high electron mobility transistor (HEMT), comprising:
   forming a semiconductor heterostructure;
   forming a first gate layer of semiconductor material on the heterostructure; forming a second gate layer, containing dopant impurities of a P type, on the first gate layer;
   removing first portions of the second gate layer so that second portions, not removed, of the second gate layer form a doped gate region; and
   thermally annealing the doped gate region so as to cause diffusion of said dopant impurities of the P type in the first gate layer and in the heterostructure, with a concentration, in the heterostructure, that decreases as a lateral distance from the doped gate region increases;
   wherein a thickness of the first gate layer, a concentration of dopant impurities of the P type of the second gate layer, and the thermal annealing are configured to produce: a concentration of dopant impurities of the P type of the doped gate region comprised between $10^{18}$ $cm^{-3}$ and $5 \times 10^{19}$ $cm^{-3}$; a concentration of dopant impurities of the P type, in an interface between the heterostructure and the first gate layer that is aligned with the doped gate region, comprised between $10^{18}$ $cm^{-3}$ and $10^{19}$ $cm^{-3}$; and a concentration of dopant impurities of the P type in portions of the heterostructure laterally displaced with respect to the doped gate region by 20 nm, of less than $10^{17}$ $cm^{-3}$.

2. The method according to claim 1, wherein thermally annealing the doped gate region comprises carrying out in succession:
   increasing a temperature of the doped gate region from room temperature to a process temperature comprised between 700° C. and 1000° C. in a time comprised between 1 s and 10 s;
   maintaining the temperature of the doped gate region constant at said process temperature for a time comprised between 10 s and 5 min; and
   reducing the temperature of the doped gate region from said process temperature to room temperature, in a time comprised between 1 s and 10 s.

3. The method according to claim 1, wherein:
   forming the second gate layer comprises forming the second gate layer having a concentration of dopant impurities of the P type comprised between $10^{18}$ $cm^{-3}$ and $5 \times 10^{19}$ $cm^{-3}$ and a thickness comprised between 10 nm and 200 nm, and
   forming the first gate layer comprises forming the first gate layer having a thickness comprised between 2 nm and 30 nm.

4. The method according to claim 1, further comprising, after forming the doped gate region, reducing a thickness of the first gate layer alongside the doped gate region, until a thickness comprised between 1 nm and 5 nm is reached.

5. The method according to claim 1, further comprising forming source and drain electrodes in electrical contact with the heterostructure, alongside, and at a distance from, the doped gate region.

6. The method according to claim 1, wherein forming the semiconductor heterostructure comprises:
forming a channel layer; and
forming a barrier layer on the channel layer, wherein forming the channel layer and the barrier layer include forming layers of respective compound materials that include elements of groups III-V.

7. The method according to claim 6, wherein forming the channel layer comprises forming a layer of intrinsic gallium nitride having a thickness comprised between 100 nm and 1 µm, and forming the barrier layer comprises forming a layer of aluminum gallium nitride having a thickness comprised between 5 nm and 30 nm.

8. The method according to claim 1, wherein forming the first gate layer comprises forming a layer of intrinsic gallium nitride, and forming the second gate layer comprises forming a layer of gallium nitride containing magnesium dopant impurities.

9. The method according to claim 1, further comprising forming a buffer layer on a semiconductor substrate and below the heterostructure, wherein the buffer layer has a thickness 20 comprised between 1 µm and 8 µm.

10. A method comprising:
manufacturing a high electron mobility transistor (HEMT), the manufacturing including:
forming a semiconductor heterostructure;
epitaxially forming a first gate layer of intrinsic semiconductor material on the heterostructure;
epitaxially forming a second gate layer of doped semiconductor material on the first gate layer;
forming a first doped gated region by removing first portions of the second gate layer so that second portions, not removed, of the second gate layer form the first doped gate region; and
perform a thermal annealing, after forming the first doped gate region, the thermal annealing causing dopant impurities from the first doped gate region to diffuse in the first gate layer and in the heterostructure;
wherein forming the semiconductor heterostructure comprises:
forming a channel layer; and
forming a barrier layer on the channel layer, wherein forming the channel layer and the barrier layer include forming layers of respective compound materials that include elements of groups III-V, wherein the intrinsic semiconductor material of the first gate layer is a different semiconductor material than the barrier layer.

11. The method according to claim 10, further comprising forming a second gate region from a first portion of the second gate layer directly under the first gate region, wherein forming the second gate region includes removing at least part of a second portion of the second gate layer while the first gate region acts as a mask, the second portion being lateral of the first portion.

12. The method according to claim 10, wherein epitaxially forming the first gate layer comprises forming a layer of intrinsic gallium nitride, and epitaxially forming the second gate layer comprises forming a layer of gallium nitride containing dopant impurities of a P type.

13. The method according to claim 10, further comprising forming a buffer layer on a semiconductor substrate and below the heterostructure, wherein the buffer layer has a thickness comprised between 1 µm and 8 µm.

14. The method according to claim 10, wherein forming the channel layer comprises forming a layer of intrinsic gallium nitride, forming the barrier layer comprises forming a layer of aluminum gallium nitride, and forming the first gate layer of intrinsic semiconductor material includes forming a layer of intrinsic gallium nitride.

15. A method of manufacturing a high electron mobility transistor (HEMT), comprising:
forming a semiconductor heterostructure that includes a channel layer and a barrier layer on the channel layer, wherein the channel layer and the barrier layer are layers of respective compound materials that include elements of groups III-V;
forming a first gate layer of semiconductor material directly on the barrier layer of the heterostructure, the semiconductor material of the first gate layer being a different material than the compound material of the barrier layer;
forming a second gate layer, containing P-type dopant impurities, on the first gate layer;
removing first portions of the second gate layer so that second portions, not removed, of the second gate layer form a doped gate region; and
thermally annealing the doped gate region so as to cause diffusion of said dopant impurities of the P type in the first gate layer and in the heterostructure, with a concentration, in the heterostructure, that decreases as a lateral distance from the doped gate region increases;
forming a buffer layer on a semiconductor substrate and below the heterostructure, wherein the buffer layer has a thickness 20 comprised between 1 µm and 8 µm.

16. The method according to claim 15, wherein the channel layer is a layer of intrinsic gallium nitride, the barrier layer is a layer of aluminum gallium nitride, and the first gate layer is a layer of intrinsic gallium nitride.

17. The method according to claim 15, wherein thermally annealing the doped gate region comprises carrying out in succession:
increasing a temperature of the doped gate region from room temperature to a process temperature comprised between 700° C. and 1000° C. in a time comprised between 1 s and 10 s;
maintaining the temperature of the doped gate region constant at said process temperature for a time comprised between 10 s and 5 min; and
reducing the temperature of the doped gate region from said process temperature to room temperature, in a time comprised between 1 s and 10 s.

* * * * *

UNITED STATES PATENT AND TRADEMARK OFFICE
CERTIFICATE OF CORRECTION

PATENT NO. : 10,896,969 B2
APPLICATION NO. : 16/254322
DATED : January 19, 2021
INVENTOR(S) : Ferdinando Iucolano Page 1 of 1

It is certified that error appears in the above-identified patent and that said Letters Patent is hereby corrected as shown below:

In the Claims

<u>Column 9, Line 23 Claim 10:</u>
"10. A method comprising:"
Should read:
--10. A method, comprising:--.

<u>Column 9, Line 31 Claim 10:</u>
"forming a first doped gated region by removing first"
Should read:
--forming a first doped gate region by removing first--.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*